United States Patent
Andre et al.

(10) Patent No.: US 9,007,811 B1
(45) Date of Patent: Apr. 14, 2015

(54) WORD LINE DRIVER CIRCUIT

(71) Applicant: Everspin Technologies, Inc., Chandler, AZ (US)

(72) Inventors: Thomas Andre, Austin, TX (US); Syed M. Alam, Austin, TX (US); Halbert S. Lin, Austin, TX (US)

(73) Assignee: Everspin Technologies, Inc., Chandler, AZ (US)

( * ) Notice: Subject to any disclaimer, the term of this patent is extended or adjusted under 35 U.S.C. 154(b) by 0 days.

(21) Appl. No.: 14/051,762

(22) Filed: Oct. 11, 2013

Related U.S. Application Data (60) Provisional application No. 61/712,548, filed on Oct. 11, 2012, provisional application No. 61/789,914, filed on Mar. 15, 2013.

(51) Int. Cl.
*G11C 13/00* (2006.01)
*G11C 8/08* (2006.01)

(52) U.S. Cl.
CPC .............. *G11C 8/08* (2013.01); *G11C 13/0028* (2013.01)
USPC .. 365/148; 365/158; 365/189.11; 365/230.06

(58) Field of Classification Search
CPC .............................. G11C 8/08; G11C 13/0028
USPC ................ 365/148, 158, 163, 189.11, 230.06
See application file for complete search history.

(56) References Cited

U.S. PATENT DOCUMENTS

| | | | |
|---|---|---|---|
| 7,283,387 B2 * | 10/2007 | Cho et al. | 365/163 |
| 7,417,887 B2 * | 8/2008 | Cho et al. | 365/148 |
| 8,526,265 B2 * | 9/2013 | Sim | 365/230.06 |
| 8,605,489 B2 * | 12/2013 | Reohr et al. | 365/149 |
| 2010/0177558 A1 | 7/2010 | Sakimura et al. | |
| 2011/0211398 A1 * | 9/2011 | Chou | 365/189.11 |

* cited by examiner

*Primary Examiner* — Tan T. Nguyen (57) ABSTRACT

A word line driver circuit allows for dynamic selection of different word line voltages for selection and deselection of memory cells included in a resistive memory array in a manner that reduces circuit complexity, device count, and leakage currents.

23 Claims, 6 Drawing Sheets

WORD LINE DRIVER CIRCUIT

CROSS REFERENCE TO RELATED APPLICATION

This application claims priority to U.S. Provisional Application No. 61/712,548 filed Oct. 11, 2012 and U.S. Provisional Application No. 61/789,914 filed Mar. 15, 2013. The contents of these provisional applications are incorporated by reference herein in their entirety.

TECHNICAL FIELD

The disclosure herein relates generally to memory devices and more particularly to circuits and methods for driving word lines in such memory devices.

BACKGROUND

Resistive memory devices store information by varying the resistance across the memory device such that a read current through a memory cell in the memory device will result in a voltage drop having a magnitude that is based on the information stored in the memory cell. For example, in certain magnetic memory devices, the voltage drop across a magnetic tunnel junction (MTJ) can be varied based on the relative magnetic states of the magnetoresistive layers within the memory cell. In such memory devices, there is typically a portion of the memory cell that has a fixed magnetic state and another portion that has a free magnetic state that is controlled to be either parallel or antiparallel to the fixed magnetic state. Because the resistance through the memory cell changes based on whether the free portion is parallel or antiparallel to the fixed portion, information can be stored by setting the orientation of the free portion. The information is later retrieved by sensing the orientation of the free portion. Such magnetic memory devices are well known in the art.

Writing magnetic memory cells can be accomplished by sending a spin-polarized write current through the memory device where the angular momentum carried by the spin-polarized current can change the magnetic state of the free portion. One of ordinary skill in the art understands that such a current can either be directly driven through the memory cell or can be the result of applying one or more voltages where the applied voltages result in the desired current. Depending on the direction of the current through the memory cell, the resulting magnetization of the free portion will either be parallel or antiparallel to the fixed portion. If the parallel orientation represents a logic "0", the antiparallel orientation may represent a logic "1", or vice versa. Thus, the direction of write current flow through the memory cell determines whether the memory cell is written to a first state or a second state. Such memory devices are often referred to as spin torque transfer memory devices. In such memories, the magnitude of the write current is typically greater than the magnitude of a read current used to sense the information stored in the memory cells.

As with other integrated circuits, it is desirable to minimize the number of devices needed to implement the desired functionality. Fewer devices can provided benefits such as reduced area, less cost, and reduced failure rates. As discussed above, the various reading and writing operations in memory devices can require different currents to flow through the memory cells. Generating and controlling those different currents in an optimized manner can help to improve read/write timing as well as reduce power consumption, leakage currents, and circuit complexity. Therefore, it is desirable to provide circuits and methods to facilitate reading and writing to such memory devices in accordance with these objectives.

DETAILED DESCRIPTION

The following detailed description is merely illustrative in nature and is not intended to limit the embodiments of the subject matter or the application and uses of such embodiments. Any implementation described herein as exemplary is not necessarily to be construed as preferred or advantageous over other implementations.

For simplicity and clarity of illustration, the drawing figures depict the general structure and/or manner of construction of the various embodiments. Descriptions and details of well-known features and techniques may be omitted to avoid unnecessarily obscuring other features. Elements in the drawings figures are not necessarily drawn to scale: the dimensions of some features may be exaggerated relative to other elements to assist improve understanding of the example embodiments.

Terms of enumeration such as "first," "second," "third," and the like may be used for distinguishing between similar elements and not necessarily for describing a particular spatial or chronological order. These terms, so used, are interchangeable under appropriate circumstances.

The terms "comprise," "include," "have" and any variations thereof are used synonymously to denote non-exclusive inclusion. The term "exemplary" is used in the sense of "example," rather than "ideal."

In the interest of conciseness, conventional techniques, structures, and principles known by those skilled in the art may not be described herein, including, for example, standard magnetic random access memory (MRAM) process techniques, fundamental principles of magnetism, and basic operational principles of memory devices.

During the course of this description, like numbers may be used to identify like elements according to the different figures that illustrate the various exemplary embodiments.

For the sake of brevity, conventional techniques related to reading and writing memory, and other functional aspects of certain systems and subsystems (and the individual operating components thereof) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter.

Figure 1:
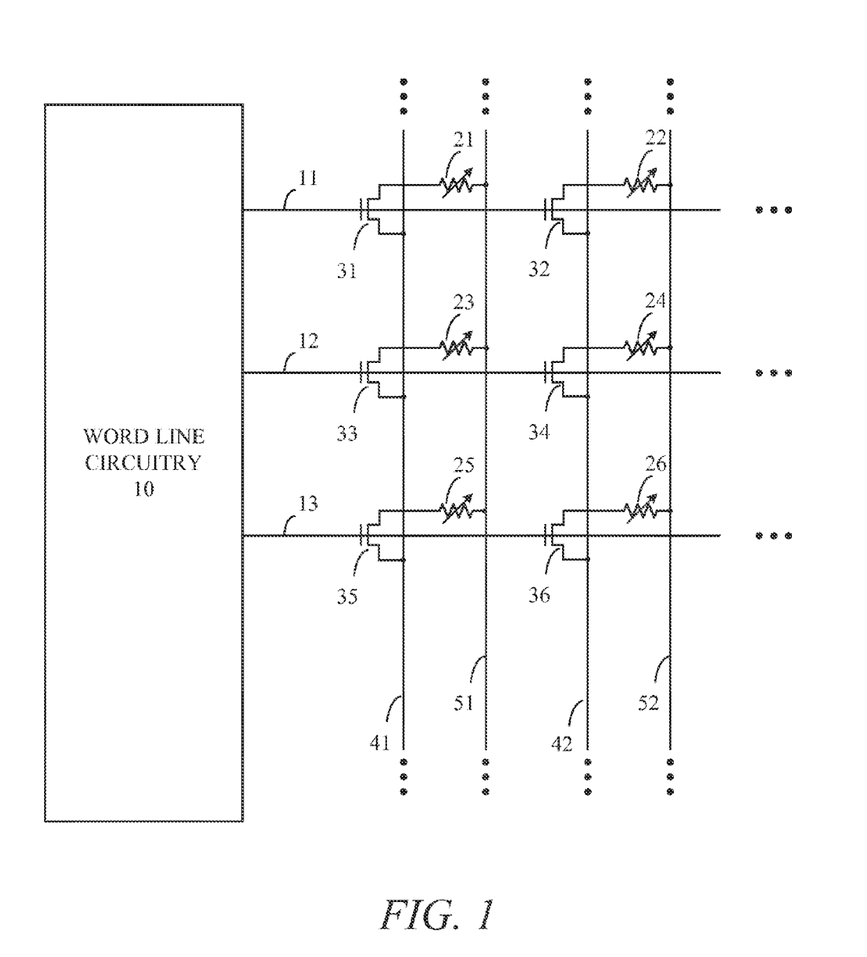
FIG. 1 is a partial circuit diagram of a memory device in accordance with an exemplary embodiment.

FIG. 1 is a schematic block diagram showing a portion of an example memory device that includes a plurality of memory cells 21-26 arranged in rows and columns. In one embodiment, the memory cells are resistive memory elements where information stored in each memory cell is represented by different amounts of resistance perceived by current flowing through the memory cell. Examples of such memory cells include magnetoresistive random access memory (MRAM) cells including spin-torque MRAM cells. In one embodiment, each of the memory cells includes an MTJ where the resistance through the memory cells indicates the information stored in the memory cell.

Each of the memory cells 21-26 has a corresponding selection transistor 31-36 that allows the particular memory cell to be selected for read and write operations. The selection transistors 31-36 are preferably thin-oxide devices with low threshold voltage for a higher current drive capability. Each corresponding set of a selection transistor 31-36 and corresponding memory cell 21-26 is coupled in series between a source line 41, 42 and a bit line 51, 52. For example, memory cell 21 is coupled in series with selection transistor 31 between bit line 51 and source line 41.

Each of the rows of memory cells can be selected for read and write operations based on a corresponding word line 11-13 being asserted. As illustrated, word line 11 is used to select memory cells 21 and 22 via their corresponding selection transistors 31 and 32. Similarly, word line 12 selects memory devices 23 and 24, whereas word line 13 selects memory devices 25 and 26. As one of ordinary skill in the art appreciates, each row may include hundreds or thousands of memory cells, and the memory device will include many rows in the array. The word line circuitry 10 decodes address information provided to the memory device to determine which of the rows of memory cells is to be accessed for reading and/or writing.

The source lines 41-42 and bit lines 51-52 are used in both reading and writing the memory cells 21-26. Sense amplifiers and write drivers associated with the source lines and bit lines, which are not shown, enable read and write currents to be passed through selected memory cells to both store information and later retrieve that information. Examples of such sense amplifiers, write drivers, and related circuitry are discussed in U.S. application Ser. No. 13/362,599.

In one embodiment, when one or more memory cells in a row are to be accessed, the information stored in each of the memory cells in the row is sensed and stored in local data-store latches. Such an operation is sometimes referred to as an activate operation. In accordance with the disclosure in U.S. application Ser. No. 13/362,599, the activate operation can include a self-referenced read operation that determines the information stored in each of the memory cells in the selected row. The self-referenced read operation includes first sampling the resistance of each of the memory cells in the selected row. After sampling the resistance of the memory cells in the row, the memory cells are all written to a first state. For example, all of the memory cells may be written to a logical "0." Following the write to the entire row of memory cells, the resistance of each of the memory cells is sampled again and compared with the previous sample taken from the same memory cell before the write operation. Based on the comparison, the original state of the memory cell (i.e. "1" or "0") can be determined based on whether or not the resistance changed significantly as a result of the writing operation. Such a self-referenced read ensures that deviations between the resistance values of different memory cells do not impact the ability to sense the information stored therein.

Once the activate operation is complete and the information from the selected row is in the local data-store latches, read and write operations can be performed by retrieving data from and storing data into the local data-store latches. When the read and write operations corresponding to the selected row are complete, a precharge operation is performed. While read and write operations to the activated row typically occur before precharging, the precharge operation can also be performed immediately after an activate operation. During the precharge operation, the information in the local data-store latches is transferred to the memory cells in the corresponding row within the memory array. Note that because the entire-row write operation performed during the sensing operation has left all of the memory cells in the row in the first state, only those memory cells that need to be changed to the second state are written during the precharge operation. For example, if the sensing operation writes all of the memory cells to a "0" (first state), then only those memory cells that are to store a "1" (second state) need to be written during the precharge operation. One of ordinary skill in the art appreciates that the first state may correspond to either a logic "1" or "0" such that the second state corresponds to the complementary "0" or "1" logic value.

As discussed above, for a spin-torque MRAM the first state can be stored in the memory cell by sending a write current through the memory cell in a first direction. Storing the second state in the memory cell is accomplished by sending a write current through the memory cell in a second, opposite direction. The write currents are typically much greater than the read current used to sense the resistance of the memory cell.

Figure 2:
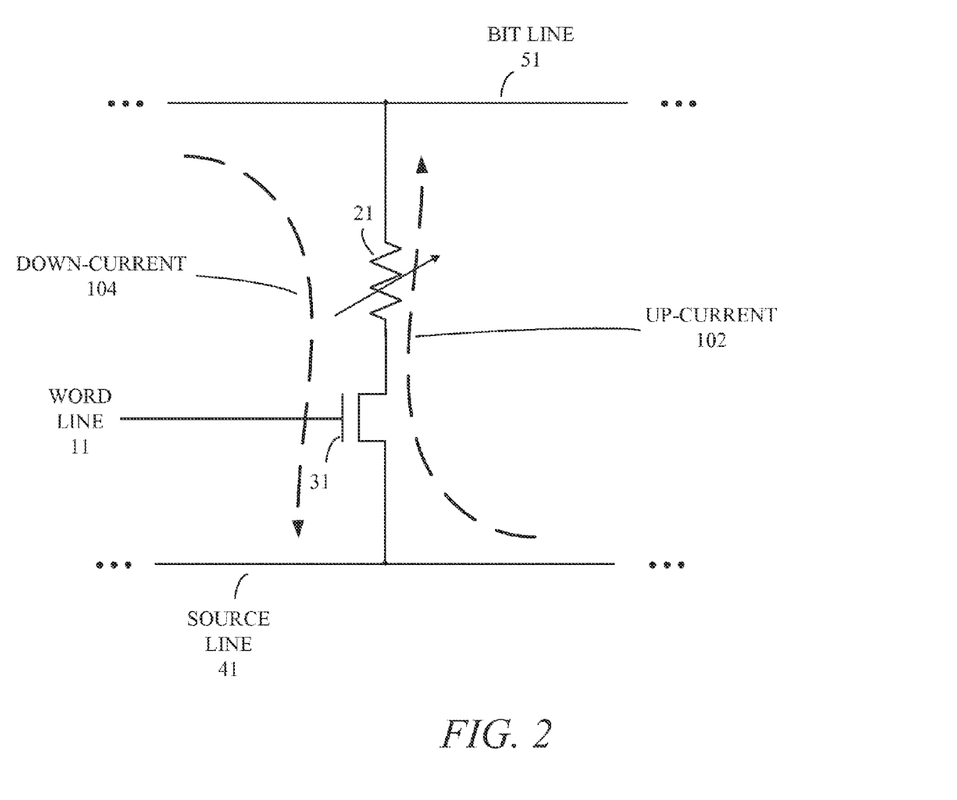
FIG. 2 is a schematic showing a memory cell and related circuitry in accordance with an exemplary embodiment.

Referring now to FIG. 2, a particular memory cell 21 and its associated circuitry is replicated from FIG. 1 for ease of reference. As is shown, the memory cell 21 is coupled in series with the selection transistor 31 between the bit line 51 and the source line 41. Assuming that driving a write current through the memory cell 21 from the bit line 51 to the source line 41 (labeled down-current 104) results in the memory cell 31 storing the first state, a write current through the memory cell 21 from the sense line 41 to the bit line 51 (labeled up-current 102) results in the memory cell 31 storing the second state. While the magnitudes of the down-current 104 and the up-current 102 are typically about the same, one of ordinary skill in the art appreciates that different magnitudes may be appropriate to adapt to the particularities of the memory cells used in the array.

In order to perform the sensing and writing operations associated with the memory cell 21, currents having different directions and magnitudes are passed through the memory cell 21 and its associated selection transistor 31. In addition to the up-current 102 and down-current 104 discussed above, a sensing current of a lesser magnitude is also used in sensing the resistance, and hence the stored state, of the memory cell 21. In the circuit structure depicted in FIG. 2, the appropriate voltage applied to the gate of the selection transistor 31 by the word line 11 can differ for the various currents to be applied through the memory cell 21. In particular, based on the voltages applied to the source line 41 and bit line 51 during each of the different write operations that results in either the up-current 102 or the down-current 104, the voltage of the word line 11 can be chosen to provide the desired current density through the memory cell 21 without exceeding certain limits that may result in reliability degradation of the selection transistor.

For example, in order to maintain a high gate-to-source voltage ($V_{GS}$) on the transistor 31 during a write operation employing the up-current 102, a higher word line voltage on word line 11 at the gate of selection transistor 31 is used in comparison to that applied to the gate for a write employing the down-current 104. The higher word line voltage helps to ensure that a sufficiently large up-current 102 flows through the selection transistor 31 and the memory cell 21. Such a higher word line voltage would not be beneficial for a down-current write because the high gate-to-source voltage ($V_{GS}$) on the transistor 31 is easier to achieve based on the relative biasing of the source line 41 during the down-current write. Moreover, if applied during down-current writing, the higher word line voltage used for up-current writes can exceed a time-dependent dielectric breakdown limit of the selection transistor 31. Hence, multiple word line voltage levels are desirable.

In order to be able to drive multiple word line voltages to the selection transistors 31-36 for the memory cells 21-26, multiple word line voltage supplies can be provided in the memory device. In an example where two separate word line voltage supplies are provided for memory cell selection, a first word line voltage supply may be associated with down-current writes and a second word line voltage supply may be associated with up-current writes. While the present discussion focuses on embodiments in which two separate word line voltage supplies are provided for memory device selection, one of ordinary skill in the art appreciates that additional word line voltage supplies can be provided based on the teachings presented herein.

Figure 3:
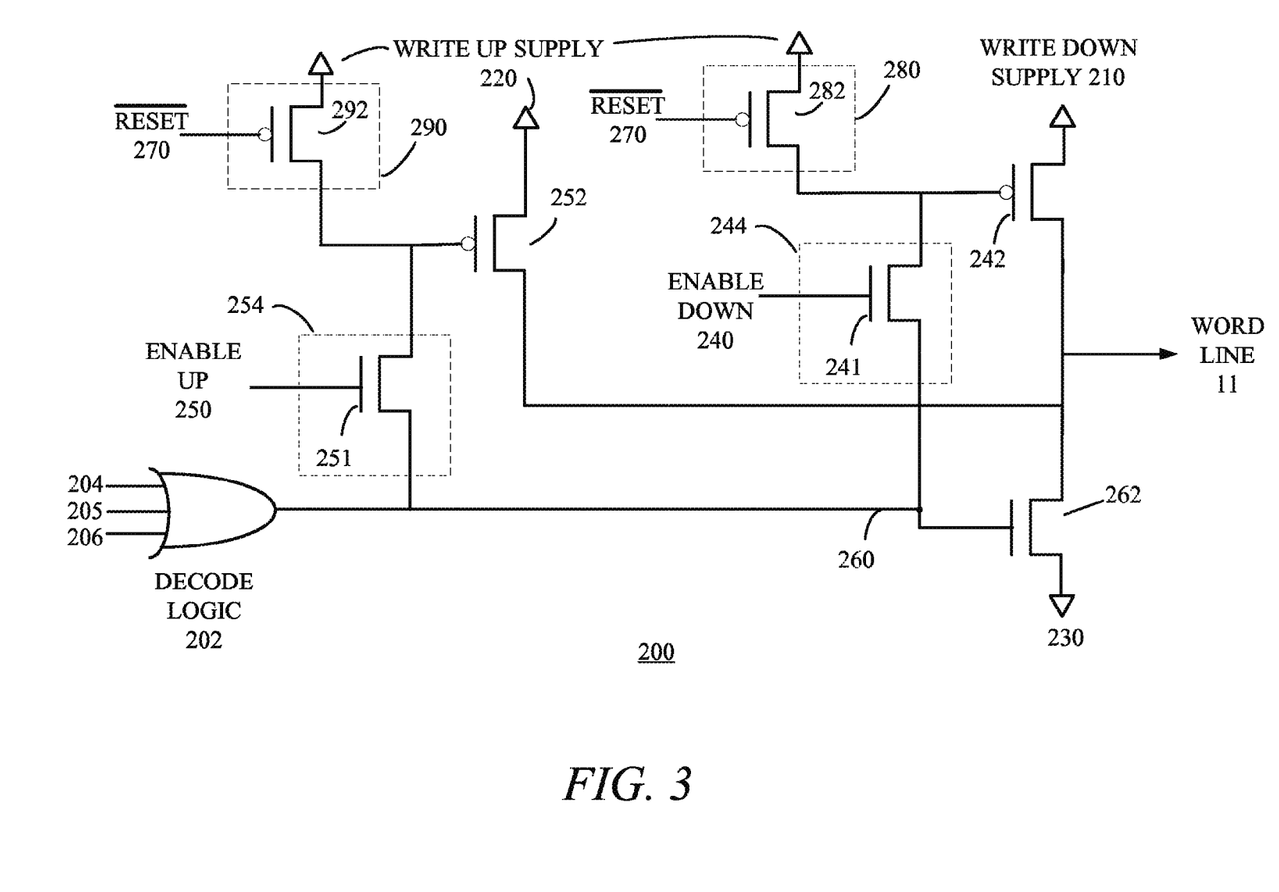
FIG. 3 is a schematic of word line driver circuitry in accordance with an exemplary embodiment.

FIG. 3 illustrates an exemplary embodiment of a word line driver circuit 200 configured to allow different word line voltages to be driven on the word line 11. FIG. 3 shows a first word line voltage supply labeled as Write Down Supply 210, a second word line voltage supply labeled as Write Up Supply 220, and a third word line voltage supply 230. While the first word line voltage supply and the second word line voltage supply correspond to a first selected state and a second selected state of the word line 11, respectively, the third word line voltage supply has a voltage level corresponding to a deselected state of the word line 11. In one embodiment, the voltage level of the second word line voltage supply, Write Up Supply 220, is greater than the voltage level of the first word line voltage supply, Write Down Supply 210. Each of the word line voltage supplies 210, 220, and 230 is independent of the other voltage supplies such that there is no charge sharing between the voltage supplies.

The circuit 200 includes Decode Logic 202 that receives inputs 204-206. In one embodiment, the Decode Logic operates using a logic voltage supply having a logic voltage level that is different than the voltage levels of each of the first, second and third word line voltage supplies discussed above. The logic voltage supply is also independent of the other voltage supplies such that there is no charge sharing between the voltage supplies. The logic voltage level is typically less than that of the Write Up Supply 220 and the Write Down Supply 210, but greater than the third voltage supply 230, which may be ground.

Figure 4:
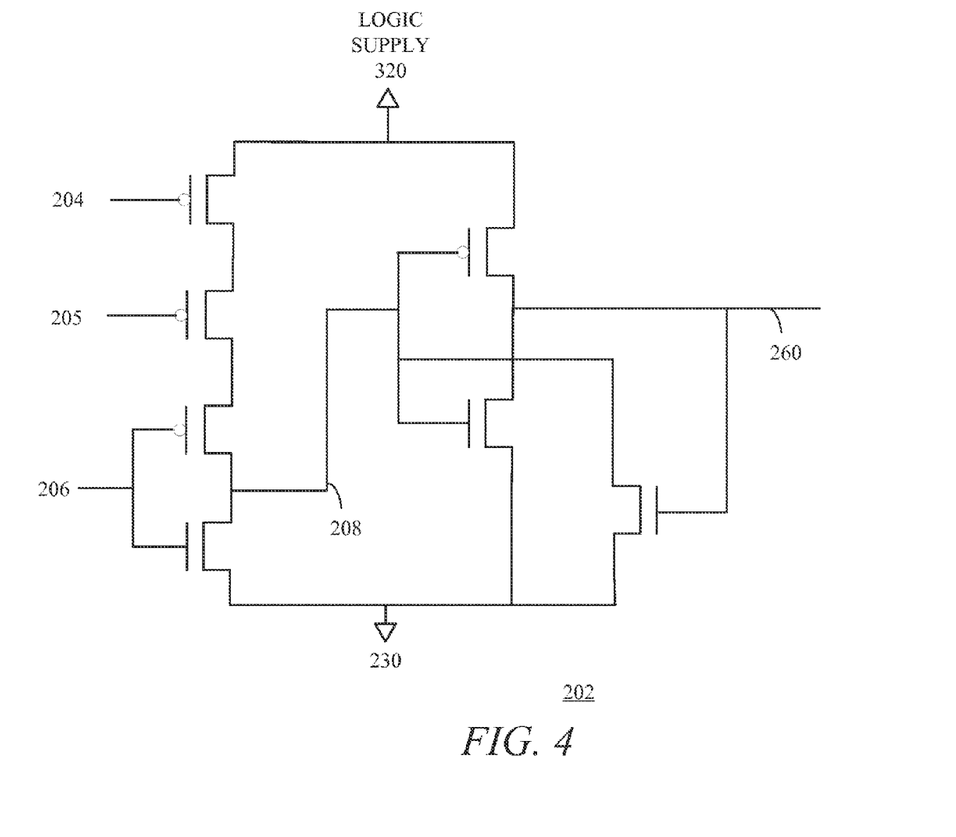
FIG. 4 is a schematic of word line decode logic in accordance with an exemplary embodiment.

Referring now to FIG. 4, a schematic diagram of one embodiment of the Decode Logic 202 is illustrated. If each of the inputs 204-206 is low, node 208 is pulled high and the output 260 is gated to the third voltage supply 230, which may be ground. In the embodiment shown, a low on each of the inputs 204-206 corresponds to selecting the word line 11, whereas if any of the three inputs 204-206 is high, the word line is deselected. One of ordinary skill in the art appreciates that other decoding schemes and different numbers of inputs may be selected based on the size of the array as well as other factors. As discussed above, the Decode Logic 202 relies on a logic voltage supply, labeled Logic Supply 320, that is independent of the other voltage supplies illustrated in FIG. 3.

Referring back to FIG. 3, when inputs 204-206 indicate that the word line 11 is to be selected, the output of the Decode Logic 202 is low. For other values on inputs 204-206 that do not correspond to word line 11 being selected, the output of the Decode Logic 202 is high. The output of Decode Logic 202 corresponds to node 260, which is also the input to word line deselection transistor 262. As such, when the word line 11 is not selected, the deselection transistor 262 gates the word line 11 to the third word line supply voltage 230, thereby ensuring that the memory cell selection transistors 31 and 32 in the row corresponding to word line 11 are deselected. Thus, the circuit 200 provides a shared deselection transistor 262 as opposed to a separate deselection transistor for each of the possible selection voltages available to be applied to word line 11.

In the embodiment shown in FIG. 3, two separate paths are provided for the two voltage supplies 210 and 220 corresponding to selecting the word line 11. In the case of a write operation corresponding to the first selected state of the word line 1, an enable circuit 244 that is coupled to the gate of the transistor 242 causes a voltage based on the Write Down Supply 210 to be driven onto the word line 210. In the embodiment shown in FIG. 3, the enable circuit 244 includes enable transistor 241. One of ordinary skill in the art appreciates that other enable circuits may be used in conjunction with selecting between the different word line voltages available. The Enable Down signal 240 is asserted high on the gate of the enable transistor 241, thereby pulling the gate of the transistor 242 low based on the output of the Decode Logic 202 being low. The transistor 242 is coupled between the Write Down Supply 210 and the word line 11. As such, when the Decode Logic indicates that the word line 11 is selected and the Enable Down signal 240 indicates that a down current write is desired, the word line 11 is driven to the first selected state, which places a voltage corresponding to the Write Down Supply 210 on the gates of the selection transistors (e.g. 31 and 32) in the row of memory cells (e.g. 21 and 22) corresponding to word line 11.

In the case of a write operation corresponding to the second selected state of the word line 11, an enable circuit 254 controls the enable transistor 251 such that a voltage based on the Write Up Supply 220 is driven onto the word line 11. In the embodiment shown in FIG. 3, the Enable Up signal 250 is asserted high on the gate of the enable transistor 251, thereby pulling the gate of the transistor 252 low based on the output of the Decode Logic 202 being low. The transistor 252 is coupled between the Write Up Supply 220 and the word line 11. When the Decode Logic 202 indicates that the word line 11 is selected and the Enable Up signal 250 indicates that an up current write is desired, the word line 11 is driven to the second selected state, which places a voltage corresponding to the Write Up Supply 220 on the gates of the selection transistors 31 and 32 in the row of memory cells corresponding to word line 11. As shown in FIG. 3, the circuit 200 provides an independently selectable pull up path to each of the Write Up Supply 220 and the Write Down Supply 210.

For reading/sensing the information stored in the memory cells 21 and 22 in the row corresponding to the word line 11, one of the voltage levels corresponding the Write Up Supply 220 or the Write Down Supply 210 may be used to drive the word line 11 such that the word line 11 is in one of the first and second selected states during such a read operation. For example, in one embodiment, the word line 11 may be driven to the first selected state by selecting the word line 11 via Decode Logic 202 and asserting the Enable Down signal 240. In other embodiments, a voltage other than those used for writing to the memory cells may be applied to the word line 11 during such a reading operation. In such embodiments, an additional path to such a read voltage supply similar to those used to select one of the Write Up Supply 220 and Write Down Supply 210 may be provided.

In addition to providing independent access to multiple voltage supplies for selecting different word line voltages, the circuit 200 of FIG. 3 also includes reset circuitry corresponding to one or both of the selectable voltage supplies. For the Write Down Supply 210, circuit 200 includes first reset circuitry 280, where the first reset circuitry 280 is coupled between the Write Down Supply 210 and the gate of the transistor 242. The /Reset signal 270 controls the first reset circuitry 280 such that the gate of the transistor 242 is pulled high when /Reset 270 is asserted low, thereby ensuring the word line 11 is not in the first selected state. In an exemplary embodiment, the first reset circuitry 280 includes an isolation transistor 282, where the gate of the isolation transistor 282 is coupled to the /Reset signal 270, the drain of the isolation transistor 282 is coupled to the gate of the transistor 242, and the source of the isolation transistor 282 is coupled to one of the Write Up Supply 220 and the Write Down Supply 210. In the embodiment shown in FIG. 3, the source of isolation transistor 282 is coupled to the Write Up Supply 220, which has a voltage level greater than that of the Write Down Supply 210.

The second reset circuitry 290 corresponds to the Write Up Supply 220. The second reset circuitry 290 is coupled between the Write Up Supply 210 and the gate of the transistor 252. While separate control signals can be used for the first and second reset circuitry 280 and 290, in the embodiment illustrated in FIG. 3, the same /Reset signal 270 controls the first reset circuitry 280 and the second reset circuitry 290. The gate of the transistor 252 is pulled high when /Reset 270 is asserted low, thereby ensuring the word line 11 is not in the second selected state. In an exemplary embodiment, the second reset circuitry 290 includes an isolation transistor 292, where the gate of the isolation transistor 292 is coupled to the /Reset signal 270, the drain of the isolation transistor 292 is coupled to the gate of the transistor 252, and the source of the isolation transistor 292 is coupled to the Write Up Supply 220.

Thus, the circuit 200 provides a common Decode Logic circuit 202 for selecting or deselecting word line 11, separate output pull-up paths for the independent and different voltage levels corresponding to the Write Up Supply 220 and the Write Down Supply 210, and a common pull down path through a shared deselection transistor 262 to the third voltage supply 230. The circuit 200 is efficient in limiting the number of devices needed to support the independent voltage supplies, thereby reducing integrated circuit area required.

Figure 5:
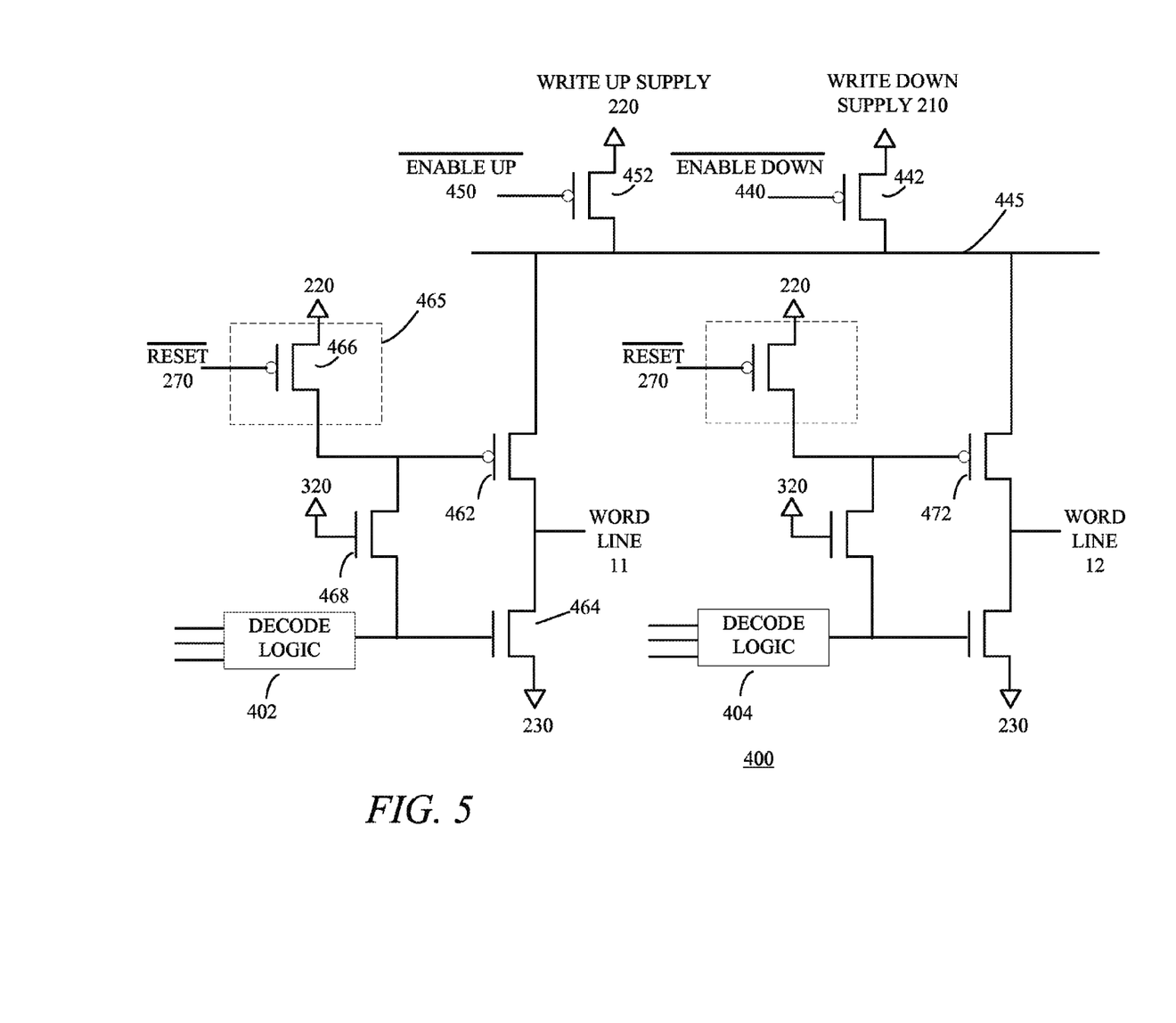
FIG. 5 is a schematic of word line driver circuitry in accordance with another exemplary embodiment.

FIG. 5 is a schematic block diagram of another embodiment of a word line driver circuit 400. Just as is the case with the circuit 200 illustrated in FIG. 3, the circuit 400 of FIG. 5 provides, for each word line, separate output pull-up paths corresponding to a first word line voltage supply (Write Down Supply 210) and a second word line voltage supply (Write Up Supply 220), as well as a common pull down path through a shared deselection transistor to the third voltage supply 230.

In the embodiment illustrated in FIG. 5, a first transistor 442 is coupled between the Write Down Supply 210 and a node 445. A second transistor 452 is coupled between the Write Up Supply 220 and the node 445. The first and second transistors 442 and 452 are controlled by an /Enable Down signal 440 and an /Enable Up signal 450, respectively, and allow for selection of either the Write Down Supply 210 or the Write Up Supply 220.

As was the case in FIG. 3, FIG. 5 includes Decode Circuitry 202 that is used to select or deselect word line 11. Circuit 400 also includes a transistor 468, where the gate of transistor 468 is coupled to the logic supply 320, the drain of the transistor 468 is coupled to the gate of a first word line selection transistor 462, and the source of the transistor 468 is coupled to the output of the Decode Circuitry 202. The source of transistor 462 is coupled to the node 445, and the drain of transistor 462 is coupled to the word line 11. When word line 11 is selected and the output of Decode Circuitry 202 is low, transistor 468 pulls the gate of first word line selection transistor 462 low, thereby driving word line 11 to either the first selected state or the second selected state depending on which of the Write Down Supply 210 and Write Up Supply 220 is selected by the first and second transistors 442 and 452. In other words, when the word line 11 is selected, the voltage level driven on the word line 11 is based on either the Write Down Supply 210 or the Write Up Supply 220, where the first and second transistors 442 and 452 provide the selection mechanism.

Like the circuit 200 of FIG. 3, circuit 400 includes a shared deselect transistor 464 for the word line 11. When the Decode Circuitry 202 indicates that the word line 11 is not selected, the deselect transistor 464 gates the word line 11 to the third voltage supply 230.

Circuit 400 also includes reset circuitry corresponding to each word line. With respect to word line 11, the reset circuitry 465 is coupled between one of the voltage supplies 210 and 220 and the gate of the word line selection transistor 462. In an exemplary embodiment, the reset circuitry 465 is coupled between the Write Up Supply 220 and the gate of the word line selection transistor 462. As shown, the Reset Circuitry 465 may include a transistor 466, where the gate of the transistor is controlled by the /Reset signal 270. When the /Reset signal 270 is asserted low, the gate of the selection transistor 462 is pulled to a high voltage that aids in deasserting the word line 11. As shown in FIG. 5, the reset circuitry is replicated for each of the word line selection circuits. The /Reset signal may be specific to a single word line selection circuit such that each selection circuit has a corresponding /Reset signal, or the /Reset signal may be shared by a group of word line selection circuits.

FIG. 5 also shows a second word line 12 that can also be selectively coupled to the node 445, thereby allowing the first and second word lines 11 and 12 to share the first and second transistors 442 and 452 as part of their respective pull-up paths. Word line 11 is selected or deselected using Decode Circuitry 402 and word line 12 is selected or deselected using Decode Circuitry 404. Decode Circuitry 402 is the same or similar to Decode Circuitry 404 with the exception of receiving different input signals or decoding the same input signals differently such that word lines 11 and 12 can be individually selected. For example, the address information that would result in word line 12 being selected would result in word line 11 being deselected. When word line 12 is selected, transistor 472 gates the node 445 to the word line 12, thereby driving word line 12 to either the first selected state or the second selected state based on which of the Write Down Supply 210 and Write Up Supply 220 is enabled using transistors 442 and 452. While the example illustrated in FIG. 5 only depicts two word lines 11 and 12 coupled to node 445 and sharing the transistors 442 and 452, one of ordinary skill in the art appreciates that many word lines can share those portions of the circuit. For example, all of the word lines in the memory device may be coupled to the node 445, or word lines in the memory device may be grouped into subsets where each subset has a shared node like node 445 and respective transistors like transistors 442 and 452 that enable their respective voltage supplies. Similarly, while only two voltage supplies 210 and 220 are shown as being selectable, additional voltage supplies may be provided that can be selectively enabled to node 445 to provide additional driving voltages on the word lines 11 and 12.

By sharing a portion of the circuitry needed to drive each word line amongst multiple word lines, the circuit 400 of FIG. 5 provides an additional advantage in terms of reducing the number of devices needed for driving the word lines, thereby conserving area in the integrated circuit. In addition, the circuit 400 may provide additional benefits due to charge sharing at the node 445 when various word lines are selected and deselected. Furthermore, having two devices in series between each of the voltage supplies 210 and 220 and each word line helps to prevent leakage.

Figure 6:
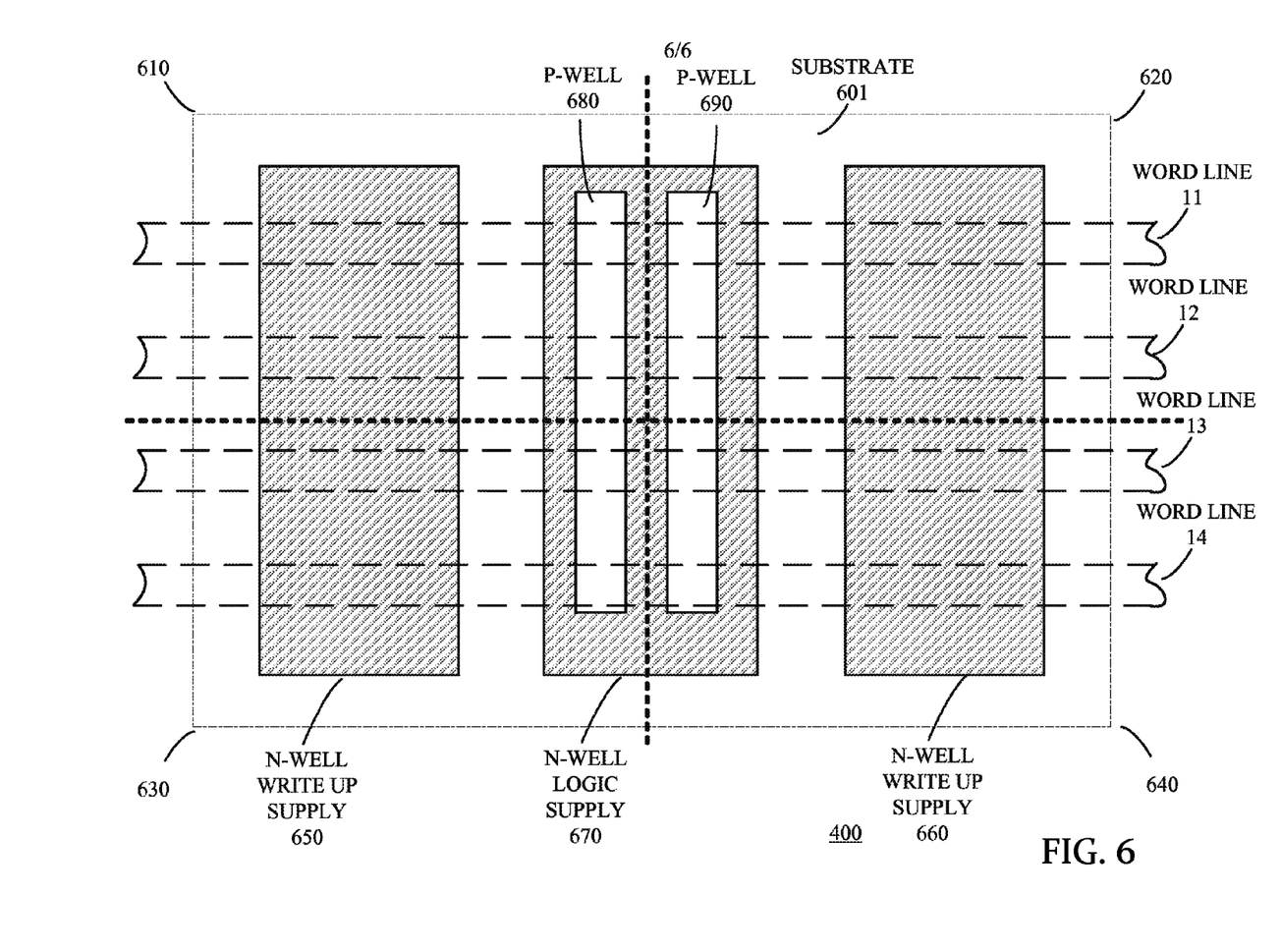
FIG. 6 is a layout diagram showing device positioning on an integrated circuit in accordance with an exemplary embodiment.

FIG. 6 illustrates a layout diagram showing one floor plan for arranging the various portions of the circuits 200 and 400 discussed above. One of ordinary skill in the art appreciates that there are many ways of arranging such circuits on the integrated circuit and that while the example illustrated provides some advantages in terms of isolation and area conservation, many other layout arrangements are apparent. FIG. 6 illustrates the layout 600 of a small portion of the word line driver circuitry corresponding to a memory device. Portions of four word lines 11-14 are shown, where it is understood that the word lines extend beyond the illustration to other portions of the memory device where they control the selection transistors for the memory cells in the array. The portion of the layout shown is divided into four quadrants 610, 620, 630, and 640. In one embodiment, quadrant 610 corresponds to the driver circuit for word line 11, quadrant 620 corresponds to the driver circuit for word line 12, quadrant 630 corresponds to the driver circuit for word line 13, and quadrant 640 corresponds to the driver circuit for word line 14. In one embodiment, much or all of the transistors and related circuitry for each respective word line are included in its corresponding quadrant.

Layout 600 includes n-wells 650 and 660 on substrate 601. The n-wells 650 and 660 are connected to the highest word line voltage level, which, in the case of the circuits 200 and 400, corresponds to the Write Up Supply 220. The pull-up output driver transistors corresponding to each of the word lines may be placed in these n-wells. For example, with respect to the circuit 200 illustrated in FIG. 3, pull-up transistors such as transistors 242 and 252 as well as reset transistors 282 and 292, all of which correspond to word line 11, would be included in the top half of n-well 650. With respect to the circuit 400 illustrated in FIG. 5, pull-up transistors such as transistor 462 and reset transistor 466, both of which correspond to word line 11, would be included in the top half of n-well 650. The enabling transistors 442 and 452 depicted in FIG. 5, which are shared by multiple word line driver circuits, can be placed in the layout 600 such that they would include multiple fingers distributed across the n-wells of the word line driver circuits that share those transistors. For example, because the transistors 442 and 452 are shared by the word line drivers for word lines 11 and 12 in FIG. 5, layout of those transistors would include fingers in at least the top half of n-well 650, which corresponds to word line 11, and the top half of n-well 660, which corresponds to word line 12.

Layout 600 also includes n-well 670 that is connected to the logic voltage supply 320. P-wells 680 and 690 are within the n-well 670 and are connected to the third voltage supply 230. Including p-wells 680 and 690 within the n-well 670 provides additional isolation. The p-channel devices corresponding to the logic voltage supply 320 are included in the n-well 670, including those included in the decode logic blocks. As one of ordinary skill in the art appreciates, while FIG. 6 illustrates the four quadrants intersecting in the n-well 670, the devices within the n-well corresponding to the four different word lines need not be segregated into respective quarters of the n-well 670. The p-wells 680 and 690 include the pull-down output devices and other n-channel transistors for the drivers. For example, with reference to FIG. 3, the enable transistors 241 and 251, the shared deselection transistor 262, and the n-channel transistors within the Decode Logic 202 corresponding to word line 11 would be included in the p-well 680. As one of ordinary skill in the art appreciates, the p-wells 680 and 690 could be merged such that the respective n-channel devices for all four word lines 11-14 would be included in a single p-well within n-well 670. Thus, the floor plan illustrated in FIG. 6 allows the word line selection circuits corresponding to the word lines to share the various wells and other layout features needed for circuit fabrication.

While exemplary embodiments have been presented above, it should be appreciated that many variations exist. Furthermore, while the description uses spin-torque MRAM devices that include an MTJ in the exemplary embodiments, the teachings may be applied to a memory array comprising any resistive memory elements or to any other circuit in which multiple driving voltage levels are required. It should also be appreciated that the exemplary embodiments are only examples, and are not intended to limit the scope, applicability, or configuration of the inventions in any way.

What is claimed is:

1. A memory device comprising:
   an array of memory cells arranged in rows and columns;
   a first word line corresponding to a first row of the rows, wherein when the first word line is selected, memory cells included in the first row are accessed;
   a first word line voltage supply having a first voltage level corresponding to a first selected state of the first word line;
   a second word line voltage supply isolated from the first word line voltage supply, the second word line voltage supply having a second voltage level corresponding to a second selected state of the first word line, wherein the second voltage level is greater than the first voltage level;
   a third word line voltage supply isolated from the first and second word line voltage supplies, the third word line voltage supply having a third voltage level corresponding to a deselected state of the first word line;
   a first transistor having a gate, a drain, and a source, the first transistor coupled between the first word line voltage supply and the first word line;
   a second transistor having a gate, a drain, and a source, the second transistor coupled between the second word line voltage supply and the first word line; and
   a first word line deselection transistor having a gate, a drain, and a source, the first word line deselection transistor coupled between the third word line voltage supply and the first word line.

2. The memory device of claim 1, wherein the memory cells include resistive memory elements.

3. The memory device of claim 2, wherein each of the resistive memory elements stores a first state when current is passed in a first direction through the resistive memory element and stores a second state when current is passed in a second direction through the resistive memory element, wherein the second direction is opposite the first direction.

4. The memory device of claim 3, wherein the first direction of current flow corresponds to the first selected state, and wherein the second direction of current flow corresponds to the second selected state.

5. The memory of claim 1, wherein the memory cells include spin-torque magnetic tunnel junction devices.

6. The memory device of claim 1 further included decoding circuitry using a logic voltage level that is isolated from and different than each of the first voltage level, the second level, and third voltage level.

7. The memory device of claim 6, wherein the decoding circuitry is coupled to the gate of the third transistor.

8. The memory device of claim 6, wherein when reading data stored in a memory cell in the first row, the first word line is in one of the first and second selected states.

9. The memory device of claim 8, wherein when reading data stored in a memory cell in the first row, the first word line is in the first selected state.

10. The memory device of claim 1 further including first reset circuitry coupled between the second word line voltage and the gate of the first transistor.

11. The memory device of claim 10, wherein the first reset circuitry includes a first isolation transistor coupled between the second word line voltage and the gate of the first transistor.

12. The memory device of claim 10 further including second reset circuitry coupled between the second word line voltage and the gate of the second transistor.

13. The memory device of claim 12, wherein the first reset circuitry includes a first isolation transistor coupled between the second word line voltage and the gate of the first transistor, and the second reset circuitry includes a second isolation transistor coupled between the second word line voltage and the gate of the second transistor.

14. The memory device of claim 1 further including a first voltage level enable circuit coupled to the gate of the first transistor.

15. The memory of claim 14, wherein the first voltage level enable circuit includes a first enable transistor having a gate, a drain, and a source, wherein the drain of the first enable transistor is coupled to the gate of the first transistor, and wherein the source of the first enable transistor is coupled to the gate of the first word line deselection transistor.

16. A memory device comprising:
an array of memory cells arranged in rows and columns;
a first word line corresponding to a first row of the rows, wherein when the first word line is selected, memory cells included in the first row are accessed;
a first word line voltage supply having a first voltage level corresponding to a first selected state of the first word line;
a second word line voltage supply isolated from the first word line voltage supply, the second word line voltage supply having a second voltage level corresponding to a second selected state of the first word line, wherein the second voltage level is greater than the first voltage level;
a third word line voltage supply isolated from the first and second word line voltage supplies, the third word line voltage supply having a third voltage level corresponding to a deselected state of the first word line;
a first transistor having a gate, a drain, and a source, the first transistor coupled between the first word line voltage supply and a node;
a second transistor having a gate, a drain, and a source, the second transistor coupled between the second word line voltage supply and the node;
a first word line selection transistor having a gate, a drain, and a source, the first word line selection transistor coupled between the node and the first word line; and
a first word line deselection transistor having a gate, a drain, and a source, the first word line deselection transistor coupled between the third word line voltage supply and the first word line.

17. The memory device of claim 16 further including:
a second word line corresponding to a second row;
a second word line selection transistor coupled between the node and the second word line; and
a second word line deselection transistor coupled between the third word line voltage supply and the second word line.

18. The memory device of claim 16 further including reset circuitry coupled between the second word line voltage supply and the gate of the first word line selection transistor.

19. The memory device of claim 18, wherein the reset circuitry includes an isolation transistor coupled between the second word line voltage supply and the gate of the first word line selection transistor.

20. The memory device of claim 16 further including an enable circuit coupled to the gate of the first word line selection transistor.

21. The memory of claim 20, wherein the enable circuit includes an enable transistor having a gate, a drain, and a source, wherein the source of the enable transistor is coupled to the gate of the first word line deselection transistor.

22. A spin torque magnetoresistive memory device comprising:
a plurality of memory cells arranged in rows and columns, each memory cell of the plurality of memory cells coupled in series with a respective selection transistor of a plurality of selection transistors, each memory cell of the plurality of memory cells configured to store a first state when a first write current is passed in a first direction through the memory cell and configured to store a second state when a second write current is passed in a second direction through the memory cell, wherein the second direction is opposite the first direction;
a first word line corresponding to a first row of the rows, wherein the first word line is coupled to the selection transistors corresponding to the memory cells included in the first row;
a first word line voltage supply having a first voltage level;
a second word line voltage supply isolated from the first word line voltage supply, the second word line voltage supply having a second voltage level;
a third word line voltage supply isolated from the first and second word line voltage supplies, the third word line voltage supply having a third voltage level;
a first transistor coupled between the first word line voltage supply and a node;
a second transistor coupled between the second word line voltage supply and the node;
a word line selection transistor coupled between the node and the first word line;
a word line deselection transistor coupled between the third word line voltage supply and the first word line; and
control circuitry coupled to the first transistor, the second transistor, the word line selection transistor, and the word line deselection transistor, the control circuitry configured to control the first transistor, the second transistor, the word line selection transistor, and the word line deselection transistor such that:
the first word line is driven using the first word line voltage supply when the first write current is to be passed through a memory cell included in the first row;

the first word line is driven using the second word line voltage supply when the second write current is to be passed through the memory cell included in the first row; and the first word line is driven using the third word line voltage supply when the memory cell in the first row is not selected.

23. The spin torque magnetoresistive memory of claim 22, wherein activate operations use the first word line voltage supply and precharge operations use the second word line voltage supply.

* * * * *